United States Patent [19]
Nagasaki et al.

[11] Patent Number: 5,051,890
[45] Date of Patent: Sep. 24, 1991

[54] PROGRAM/DATA MEMORY EMPLOYED IN MICROCOMPUTER SYSTEM

[75] Inventors: Kazunori Nagasaki; Kazuhiro Takeuchi, both of Tokyo, Japan

[73] Assignee: NEC Corporation, Tokyo, Japan

[21] Appl. No.: 414,248

[22] Filed: Sep. 29, 1989

[30] Foreign Application Priority Data

Sep. 29, 1988 [JP] Japan ................. 63-244945

[51] Int. Cl.$^5$ ............................................. G06F 12/02
[52] U.S. Cl. ............................. 364/200; 364/247.2; 364/251.3; 364/232.8
[58] Field of Search ............. 364/200, 900; 365/174, 365/230.08, 236

[56] References Cited

U.S. PATENT DOCUMENTS

| | | | |
|---|---|---|---|
| 4,408,276 | 10/1983 | Nishibe | 364/200 |
| 4,636,986 | 1/1987 | Pinkham | 365/230.08 X |
| 4,713,796 | 12/1987 | Ogive et al. | 365/230.08 X |
| 4,783,768 | 11/1988 | Tanimura | 365/230.08 |
| 4,855,958 | 8/1989 | Ikeda | 365/230.08 |

*Primary Examiner*—Thomas M. Heckler
*Attorney, Agent, or Firm*—Foley & Lardner

[57] ABSTRACT

A semiconductor memory unit employed in a microcomputer system includes an address counter for fetching address information from a microcomputer in response to an address latch signal from the microcomputer. The address counter further receives an updating control signal from the microcomputer and updates the fetched address information by one in response to each updating control signal. The memory device further includes a program memory for storing a string of instructions and an address decoder circuit for accessing the program memory in response to the address information from the address counter. Since the address information is updated by the updating control signal, the microcomputer fetches and executes the successive instructions without supplying the respective address information to the memory device.

9 Claims, 7 Drawing Sheets ns, a first terminal supplied with an address latch signal, a second terminal supplied with a data selection signal taking one of first and second states, a third terminal supplied with an updating control signal, a first control signal generator generating a first latch signal in response to the address latch signal and the data selection signal taking the first state and a count updating signal in response to the updating control signal and the data selection signal taking the first state, a second control signal generator generating a second latch signal in response to the address latch signal and the data selection signal taking the second state, an address counter fetching address information at the set of address/data terminals in response to the first latch signal and updating the fetched address information in response to the count updating signal, an address register fetching address information at the set of address/data terminals in response to the second latch signal, a memory portion having a plurality of addressable memory locations, a first access circuit accessing the memory portion in response to the address information from the address counter to read out data therefrom, a second access circuit accessing the memory portion in response to the address information from the address register to read out data therefrom, and a data transfer circuit for transferring the data from the memory portion to the set of address/data terminals.

PROGRAM/DATA MEMORY EMPLOYED IN MICROCOMPUTER SYSTEM

BACKGROUND OF THE INVENTION

The present invention relates to a semiconductor memory device and, more particularly, to a semiconductor integrated circuit memory device used as a program/data memory device for a microcomputer system.

A microcomputer system includes a microprocessor (or a microcomputer) and a memory device which are interconnected through a system bus. The memory device stores a string of instructions for a program and operand data to be executed and processed by the microprocessor. In operation, the microprocessor makes access to the memory device by use of a program address designating a memory location containing an instruction to be executed, and then fetches and executes the instruction read out of the designated memory location. In the instruction execution, if operand data is required, the microprocessor makes access to the memory device by use of a data address for designating a memory location into which that operand data is stored, and then fetches the operand data from the memory data. The processed resultant data is, if necessary, written into the memory device. The microprocessor again makes access to the memory device by use of a next program address to fetch and execute a next instruction to be executed.

In general, the respective instructions for a program are stored in the successive memory locations of the memory device. The microprocessor executes the respective instructions in the address order, so long as it does not execute such an instruction as a jump or branch instruction causing change in the program sequence flow.

However, the microprocessor in the system employing a conventional memory device always supplies the respective program addresses to the device to fetch the corresponding instructions therefrom, irrespective of those instructions being stored in the successive memory locations of the device. For this reason, a bus cycle for accessing the memory device by use of the program memory is always initiated before each instruction execution, resulting in the restriction of the processing speed. In particular, the system employing an address/data multiplex system bus lowers the processing speed remarkablly.

SUMMARY OF THE INVENTION

Therefore, an object of the present invention is to provide an improved semiconductor memory device suitable for being employed in a microcomputer system.

Another object of the present invention is to provide a semiconductor memory device which can enhance the processing speed of a microcomputer system employing that memory device.

Still another object of the present invention is to provide a memory device suitable for being employed in a microcomputer system in which a microprocessor used therein can be free from the supply of program addresses for all the instructions to the memory device.

Still another object of the present invention is to provide a microcomputer system which includes a microprocessor (or a microcomputer) and an improved memory device for storing a program and operand data.

A semiconductor memory device according to the present invention comprises a set of address/data termi- Thus, the address information fetched in the address counter is updated sequentially by applying the updating control signal to the third terminal. Therefore, in a microcomputer system employing the semiconductor memory device, a microprocessor can fetch and execute the successive instructions by setting the address counter with an address for the starting instruction of the successive instructions and applying the updating control signal. The application of all the program addresses to the memory device is not required. The access to the memory location for the operand data is carried out by the address register and the corresponding access circuit, and hence the program address does not disappear even when the operand read bus cycle is inserted.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE EMBODIMENTS

Figure 1:
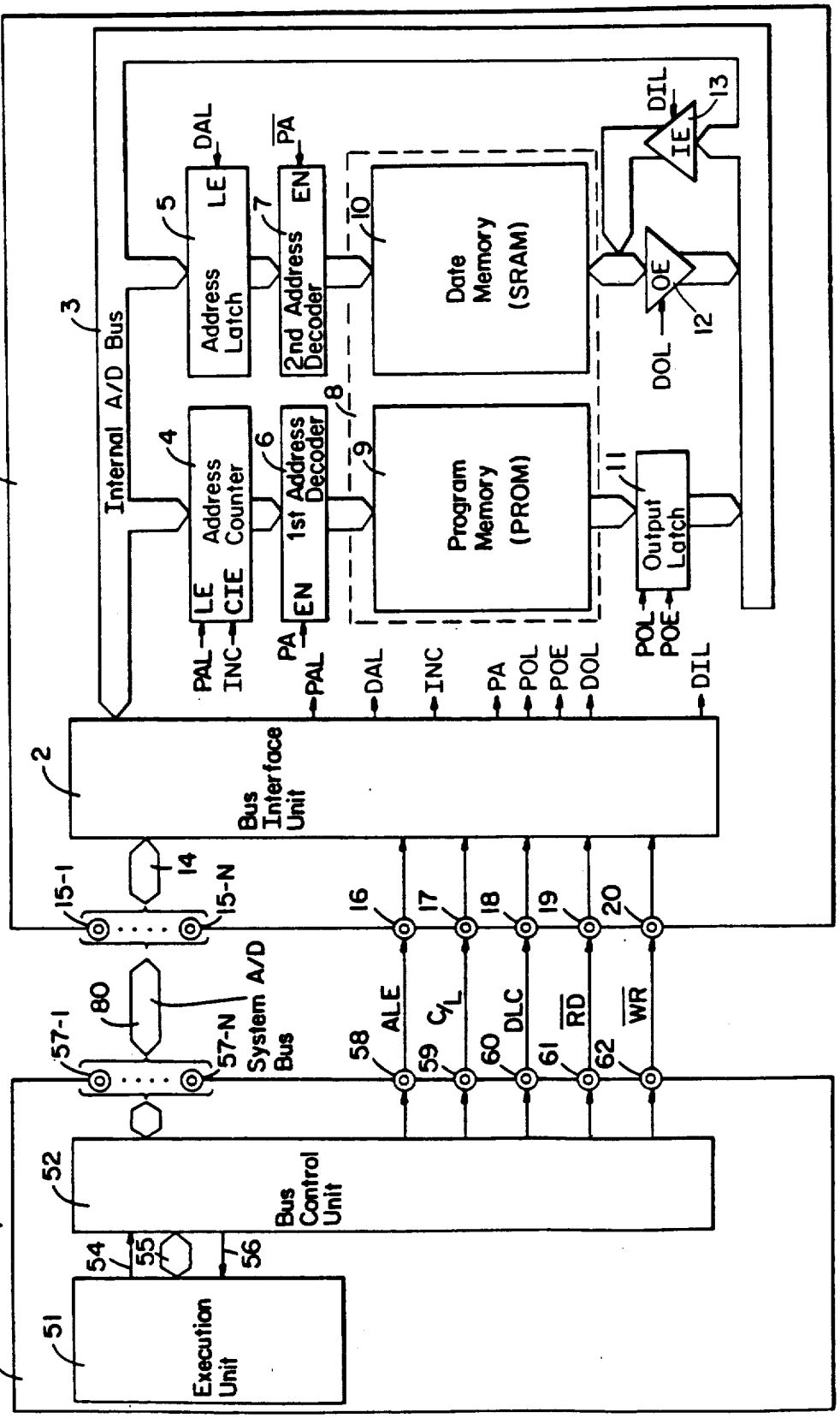
FIG. 1 is block diagram representative of a microcomputer system employing a semiconductor memory device according to an embodiment of the present invention.

Referring to FIG. 1, there is shown in a block form a microcomputer system 100 including a semiconductor memory device 1 according to an embodiment of the present invention and a microprocessor 50, each of which is fabricated as a semiconductor monolithic integrated circuit device. The memory device 1 has a set of address/data multiplex terminals 15-1 to 15-N which are in turn connected through a system address/data multiplex bus 80 to a set of address/data multiplex terminals 57-1 to 57-N of the microprocessor 50. The memory device 1 further has five control terminals 16 to 20 which are supplied with an address latchenable signal ALE, a counter/latch selection signal C/L, an increment control signal DLC, a read-enable signal RD and a write enable signal WR, respectively, from the microprocessor 50. The set of address/data multiplex terminals 15-1 to 15-N and the control terminals 16 to 20 are connected to a bus interface unit 2 which controls address and data transmission between the terminals 15 and an internal address/data bus 3 and generates internal control signal PAL, DAL, INC, PA, POL, POE, DOL and DIL, which are described in detail later, in response to the control signals ALE, C/L, DLC, RD and WD. The internal A/D bus 3 is coupled to an address counter 4 and an address latch circuit 5. The counter 4 latches data on the bus 3 as a program address in response to the falling edge of the signal PAL supplied to a latch-enable node LE thereof and increments the program address latched therein by one in response to each leading edge of the signal INC supplied to a count terminal CIE thereof. The address latch circuit 5 latches data on the bus 3 as a data address in response to the falling edge of the signal DAL supplied to a latch-enable terminal LE thereof. The content of the address counter 4 is supplied to a first address decoder 6 which are activated by the high level of the signal PA to decode the content from the counter 4 and to access a program memory 9. A second address decoder 7 decodes the content of the address latch 5 in response to the high level of the inverted signal $\overline{PA}$ and access a data memory 10. The program memory 9 is constituted of a programmable read only memory and stores a string of instructions for a program to be executed by the microprocessor 50. The data memory 10 is constituted by a static type random access memory 10 and stores a plurality of operand data. The instruction read out of the program memory 9 is latched by an output latch circuit 11 in response to a leading edge of the signal POL. The latched instruction of the latch circuit 11 is transferred onto the bus 3 in response to the high level of the signal POE. The data read out of the data memory 10 is supplied to an output buffer circuit 12 which is made open by the high level of the signal DOL to transfer the data supplied thereto onto the bus 3. An input buffer 13 is made open by the high level of the signal DIL to transfer the data on the bus 3 to the data memory 10.

The microprocessor 50 includes an execution unit 51 executing each instruction stored in the memory 1 and a bus control unit 52 initiating an instruction fetch bus cycle, an operand data read bus cycle and a data write bus cycle by use of the system A/D bus 80 from the terminals 57-1 to 57-N and the control signals ALE, C/L, DLC, $\overline{RD}$ and $\overline{WR}$ from terminals 58 to 62. The execution unit 51 is coupled to the bus control unit 52 through a bus request signal 54 and an internal address-/data bus 55. The execution unit 51 turns the bus request signal 54 to the active level to inform the bus control unit 52 of requiring to fetch an instruction or an operand data from the memory 1 or to write data thereinto. The unit 51 further supplies a program or data address and data via the bus 55 to the unit 52. When the bus control unit 52 accepts the bus cycle request from the unit 51, it returns an acknowledge signal 56 to the execution unit 51 and then initiates the desired bus cycle. The address latch enable signal ALE indicates a timing at which an program or data address appears on the system bus 80. The count/latch selection signal C/L designates the current bus cycle to an instruct fetch cycle or a data read/write cycle. The count increment signal DLC is provided in accordance with the present invention and used for incrementing the content of the address counter 4. The read-enable and write-enable signals $\overline{RD}$ and $\overline{WD}$ designate data read and write bus cycles, respectifely.

Figure 2:
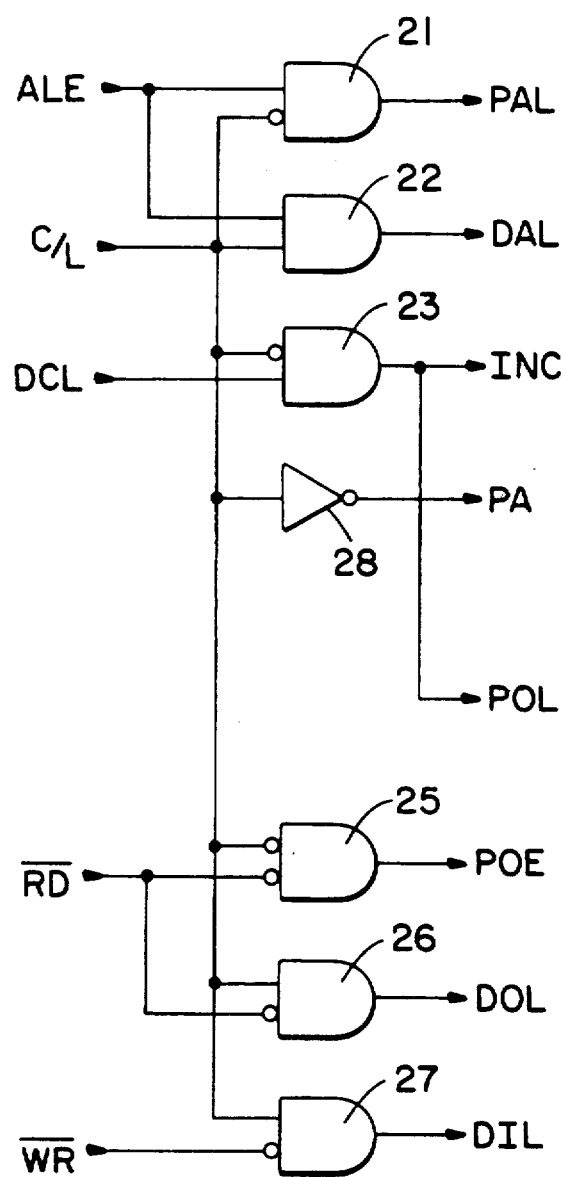
FIG. 2 is a logic circuit diagram representative of a part of a bus interface unit shown in FIG. 1.

Referring to FIG. 2, the bus interface unit 2 includes six AND gates 21, 23 and 25 to 27 and one inverter 28, which are connected as shown, in order to generate eight internal control signals PAL, DAL, INC, PA, POL, POE, DOL and DIL from five external control signals ALE, C/L, DCL, $\overline{RD}$ and $\overline{WR}$. As apparent from FIG. 2, when the signal C/L takes the low level to designate the instruction fetch bus cycle, only the AND gates 21, 23 and 25 are made open, so that the internal signals PAL, INC, POL and POE are generated. When the signal C/L takes the high level to designate the data read/write bus cycle, the AND gates 22, 26 and 27 are made open.

Next, operation will be described below with reference to FIGS. 1 to 3.

The bus cycle of the microprocessor 50 is constituted of four states $T_1$, $T_2$, $T_3$ and $T_I$ and a vacant state. The bus control unit 52 responds to each state to control the system bus 80 and generate the control signals.

When the execution unit 51 changes the program sequence flow by the execution of a jump or branch instruction or by resetting by a reset signal (not shown), the bus control unit 52 initiates the bus states $T_1$, $T_2$ and $T_I$ in accordance with the request from the execution unit 51 to fetch an instruction at the jump or branch address. More specifically, at the start timing $t_1$ of the state $T_1$, the bus control unit 58 changes the signal ALE to the high level and the C/L signal to the low level to inform the memory device 1 an instruction fetch cycle. The unit 52 further transfers a program address PA1 onto the bus 80 at an intermediate timing $t_2$ of the state $T_1$. Since the signal C/L is low level, the AND gate 21 transfers the signal ALE to the address counter 4 as the signal PAL. The address counter 4 thereby fetches the program address PA1 transferred onto the bus 3 from the bus interface unit 2. Since the signal C/L is at the low level, the high level signal PA activates the first address decoder 6, so that the program memory 9 is accessed by the program address PA1. The bus control unit 52 returns the signal ALE to the bus level at the end timing $t_3$ of the state $T_1$ (i.e., at the start timing of the state $T_2$). In response thereto, the address counter 4 latches the program address PA1, and an instruction PI stored in an address location of the memory 9 designated by the program address PA1 is read out therefrom and then transferred to the output latch circuit 11. At the timing $t_3$, the bus control unit 52 further changes the signal DLC to the low level. At the intermediate timing $t_4$ of the state $T_2$, the unit 52 returns the signal DLC to the high level and changes the signal RD to the low level. Accordingly, the address counter 4 increments the program address PA1 by one to produce a next program address PA2. Moreover, by the signal POL and POE, the output latch 11 latches the instruction P1 and transfers the same onto the bus 3. The instruction P1 on the bus 3 is transferred onto the system bus 80 by the bus interface unit 2. The bus control unit 52 fetches the instruction P1 on the system bus 80 at the end timing $t_5$ of the state $T_2$ and supplies it to the execution unit 51. At the timing $t_5$, the bus control unit 52 changes the signal DLC to the low level, so that a next instruction P2 is read out from the program memory 9 by the program address PA2 and transferred to the output latch circuit 11. At the timing $t_6$ of the state $T_f$, the bus control unit 52 changes the signal DLC and $\overline{RD}$ to the high level. In response thereto, the content of the address counter 4 is incremented by one to produce a next program address PA3, and the output latch circuit 11 latches the instruction P2. Since the signal $\overline{RD}$ is returned to the high level, no signal POE is generated, so that the instruction P2 is not transferred onto the bus 3. Thus, the instruction fetch cycle based upon the jump or branch processing is completed.

The microprocessor to thereafter executes the respective instructions in the address order. In order that the microprocessor 50 executes each instruction without supplying the respective program addresses to the memory device 1, the bus control unit 52 initiates the state $T_3$ by use of the signal DLC and $\overline{RD}$. More specifically, at the timing $t_8$ of the state $T_3$, the unit 52 changes the signal $\overline{RD}$ to the low level. At this time, the signal C/L is held at the low level. Therefore, the signal POE is generated, so that the instruction P2 is transferred onto the bus 3 from the output latch circuit 11. The instruction P2 on the bus 3 is in turn transferred onto the system bus 80 by the bus interface unit 2. The unit 52 fetches and supplies the instruction P2 to the execution unit 51 and further changes the signal DLC to the low level at the timing $t_9$. In response to the change to the low level of the signal DLC, an instruction P3 is read out of the program memory 9 by the program address PA3 from the counter 4. At the end timing $t_{10}$ of the state $T_3$, the bus control unit 52 returns the signal DLC to the high level. In response thereto, the instruction P3 is latched in the output circuit 11 and further transferred onto the system bus 80 through the internal bus 3 and the bus interface unit 2. Furthermore, the content of the address counter 4 is incremented by one to produce a next program address PA4. Thus, by performing the bus state $T_3$ three times, the microprocessor 50 can fetch three instructions P2, P3 and P4 continuously without producing the respective addresses thereof.

In the instruction execution, when the execution unit 51 requires operand data, it requests the data read bus cycle to the bus control unit 52. In response to this request, the unit 52 initiates the bus states $T_1$, $T_2$ and $T_f$. More specifically, at the start timing $t_{16}$ of the state $T_1$, the unit 52 changes the signal ALE to the high level and transferres a read data address RDA1 onto the system bus 80 at the intermediate timing $t_{17}$ thereof. Since the current bus cycle is the data read bus cycle, the signal C/L is changed to the high level. The AND gate 22 thus produces the signal DAL, whereas the signal PAL is not generated. Therefore, the address latch circuit 5 fetches and supplies the read data address RDA1 to the second address decoder 7 which is in the activated condition by the high level signal $\overline{PA}$. By the change of the signal ALE to the low level, the address latch circuit 5 latches the read data address RDA1, and operand data RD1 is read out from the data memory 10. Since the signal $\overline{RD}$ is changed to the low level at the timing $t_{18}$ of the state $T_2$, the signal DOL is generated and supplied to the output buffer 12. Thus, the output buffer 12 transfers onto the bus 3 the operand data RD1 which is in turn supplied to the microprocessor via the bus interface unit 2 and the system bus 80. At the start timing $t_{19}$ of the state $T_f$, the bus control unit 52 fetches and supplies the operand data RD1 to the execution unit 51. Thus, the data read bus cycle is completed.

Thereafter, the bus control unit 52 initiates the bus states $T_3$ and $T_f$ in accordance with the request from the unit 51, so that a next instruction P5 is fetched from the memory device 1. In response to the data write request from the unit 51, the bus control unit 52 initiates the bus states $T_1$, $T_2$ and $T_f$ with producing the signal $\overline{WR}$. As a result, data WR1 from the execution unit 51 is written via the system bus 80, the bus interface unit 2, the internal bus 3 and the input buffer 13 into a memory location of the data memory 10 designated by a write data address WDA1 latched in the address latch circuit 5.

As described above, in the microcomputer system employing the memory device 1, the respective instructions stored in the successive addresses of the program memory 9 are fetched and executed by the microprocessor 50 only by applying the starting address of the successive addresses to the memory 1 and without applying the remaining program addresses.

Figure 4:
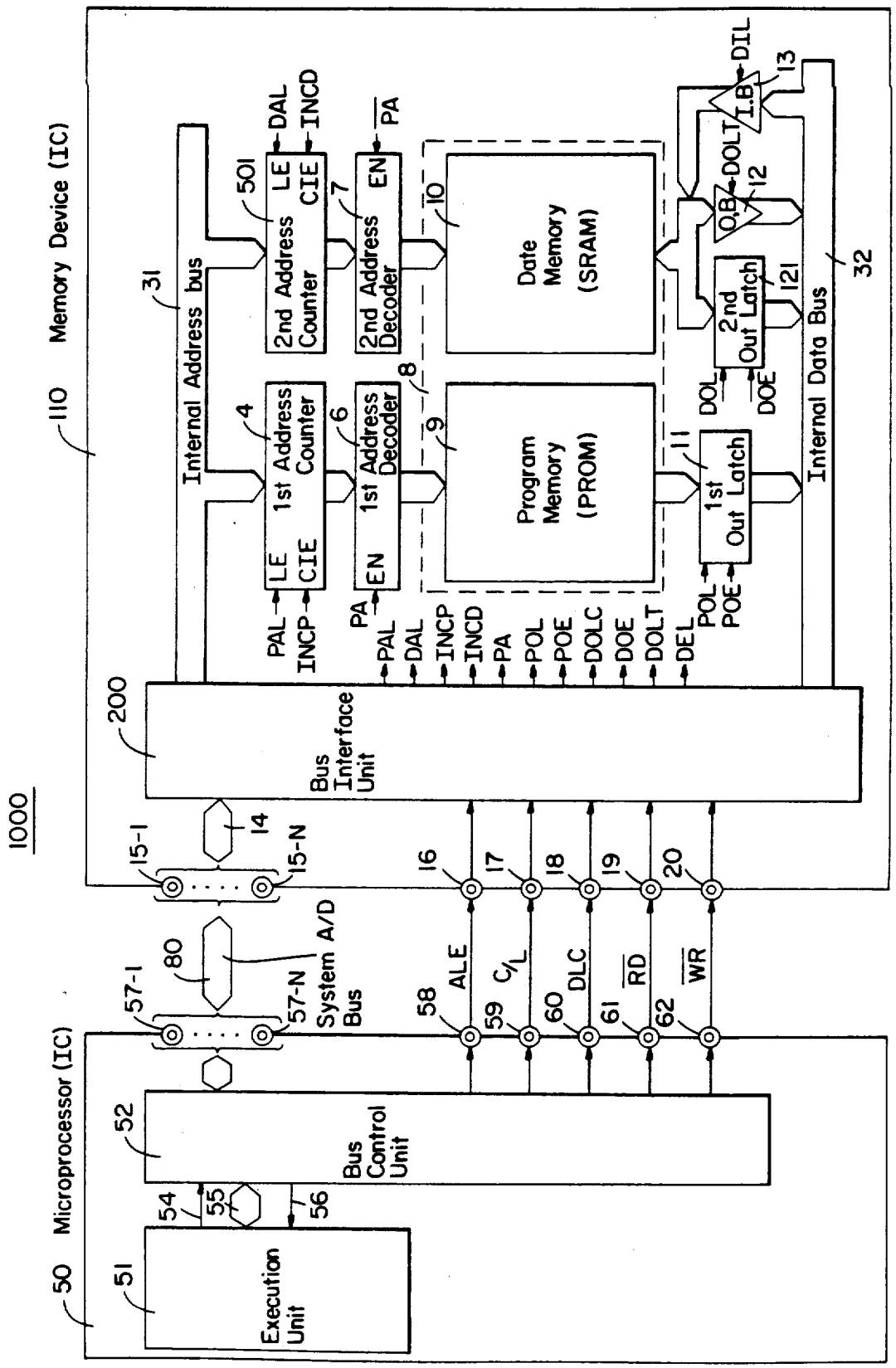
FIG. 4 is a block diagram representative of a microcomputer system employing a semiconductor memory device according to another embodiment of the present invention.

Referring to FIG. 4, there is shown a microcomputer system 1000 employing a memory device 110 according to another embodiment of the present invention, wherein the same constituents as those shown in FIG. 1 are denoted by the same reference reference numerals to omit further description thereof. In this embodiment, the memory device 110 includes an internal address bus 31 and an internal data bus 32 separately from each other. A second address counter 501 is provided in place of the address latch circuit 5 of FIG. 2 and a second latch circuit 121 is further provided for reading out operand data stored in the successive address locations of the data memory 10 without the microprocessor 50 applying the respective data addresses to the memory 110. The second address counter 501 latches an address on the bus 31 in response to the falling edge of an signal DAL and increments the latched address by one in response to each leading edge of a signal INCD. The second output latch circuit 121 latches the data read out of the data memory 10 in response to the leading edge of a signal DOL, and the data latched in the circuit 121 is transferred onto the data bus 32 by the high level of a signal 121. The output buffer 12 is controlled by a signal DOLT in place of the signal DOL of FIG. 1. These internal control signals DAL, INCD, DOL, DOE and DOLT are generated by a bus interface unit 200 in addition to the remaining control signals PAL, INCP, PA, POL, POE and DIL.

Figure 5:
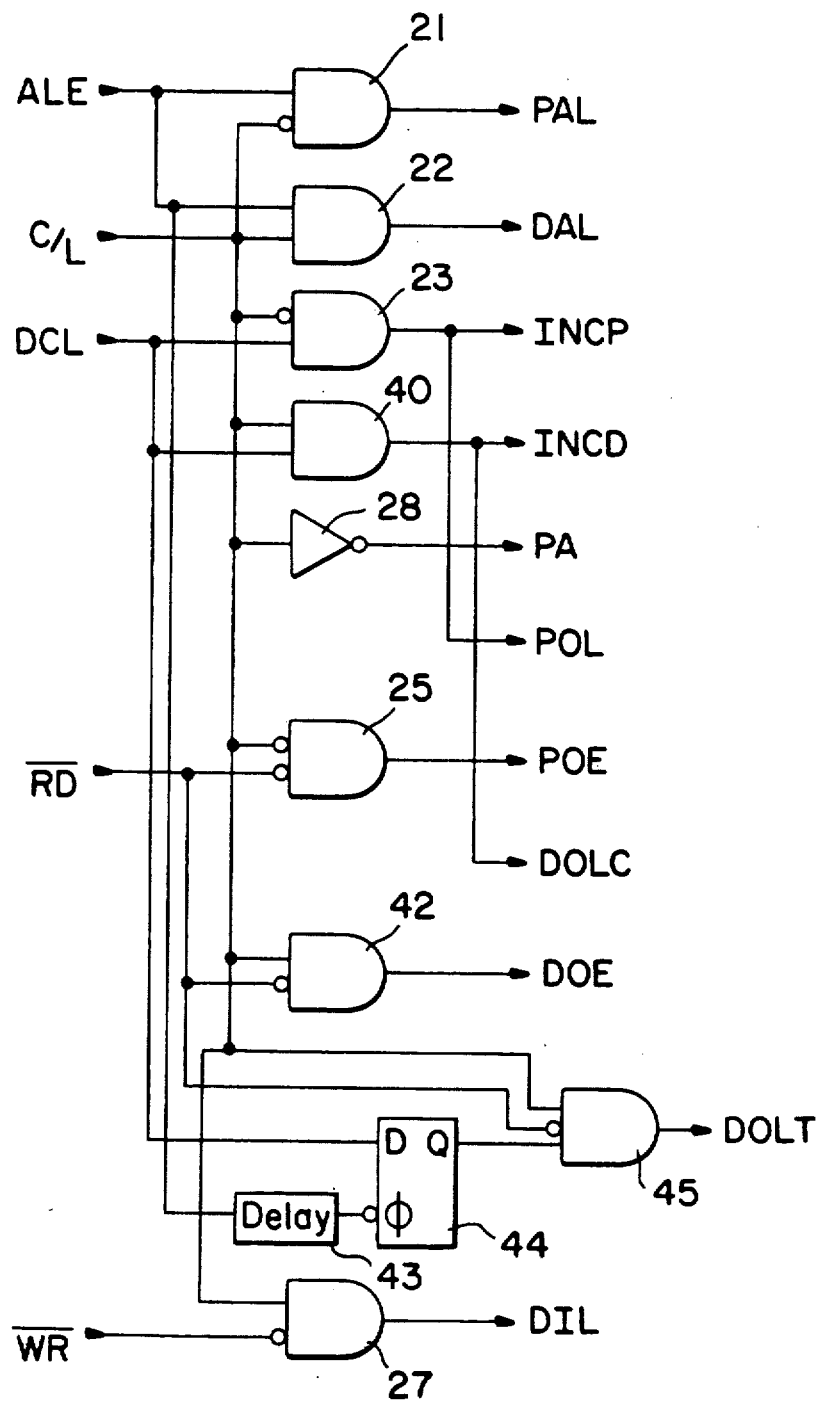
FIG. 5 is a logic circuit diagram representative of a part of a bus interface unit shown in FIG. 4.

Referring to FIG. 5, the bus interface unit 200 includes three AND gates 40, 42 and 45, one delay circuit 43 and one D-type flip-flop circuit 44 in addition to the AND gates 21, 22, 23, 25 and 27 and the inverter 28 shown in FIG. 2. When the signal C/L takes the low level to designate the instruction fetch bus cycle, only the AND gates 21, 23 and 25 are made open. On the other hand, the high level of the signal C/L makes the AND gates 22, 40, 42, 45 and 27 open.

Figure 3A:
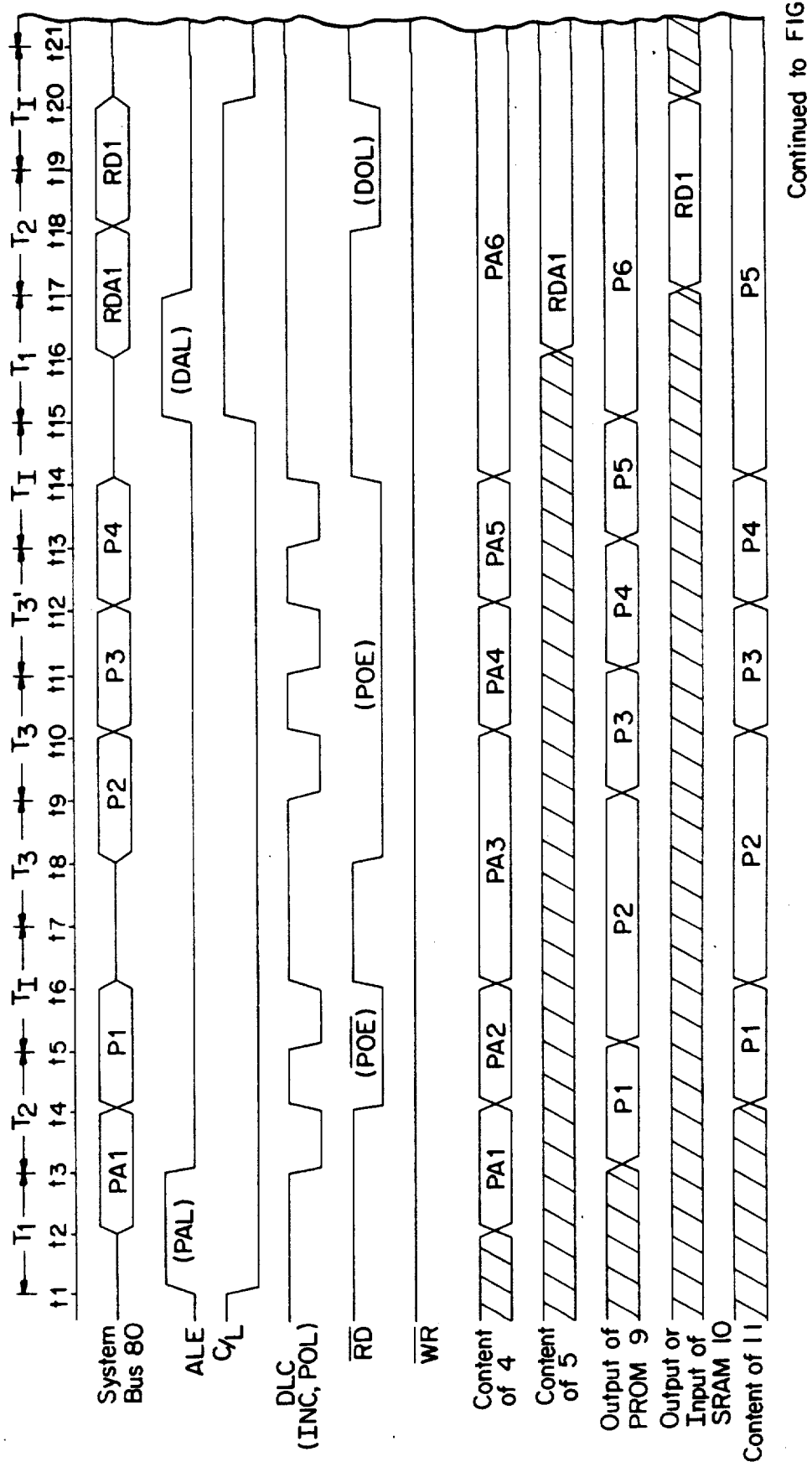
FIGS. 3A and 3B are timing charts representative of an operation of the microcomputer system shown in FIG. 1.
Figure 3B:
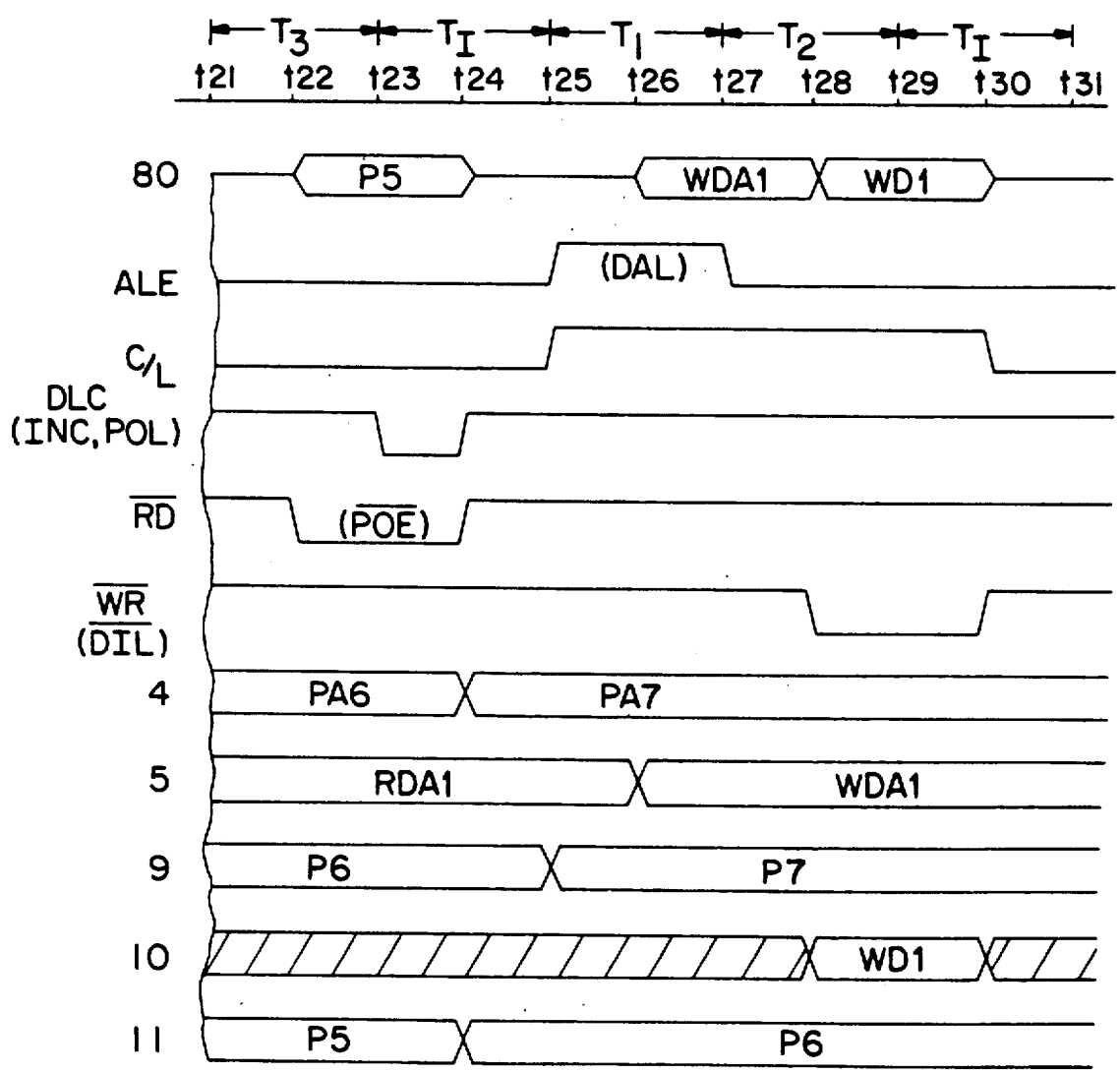
Figure 6:
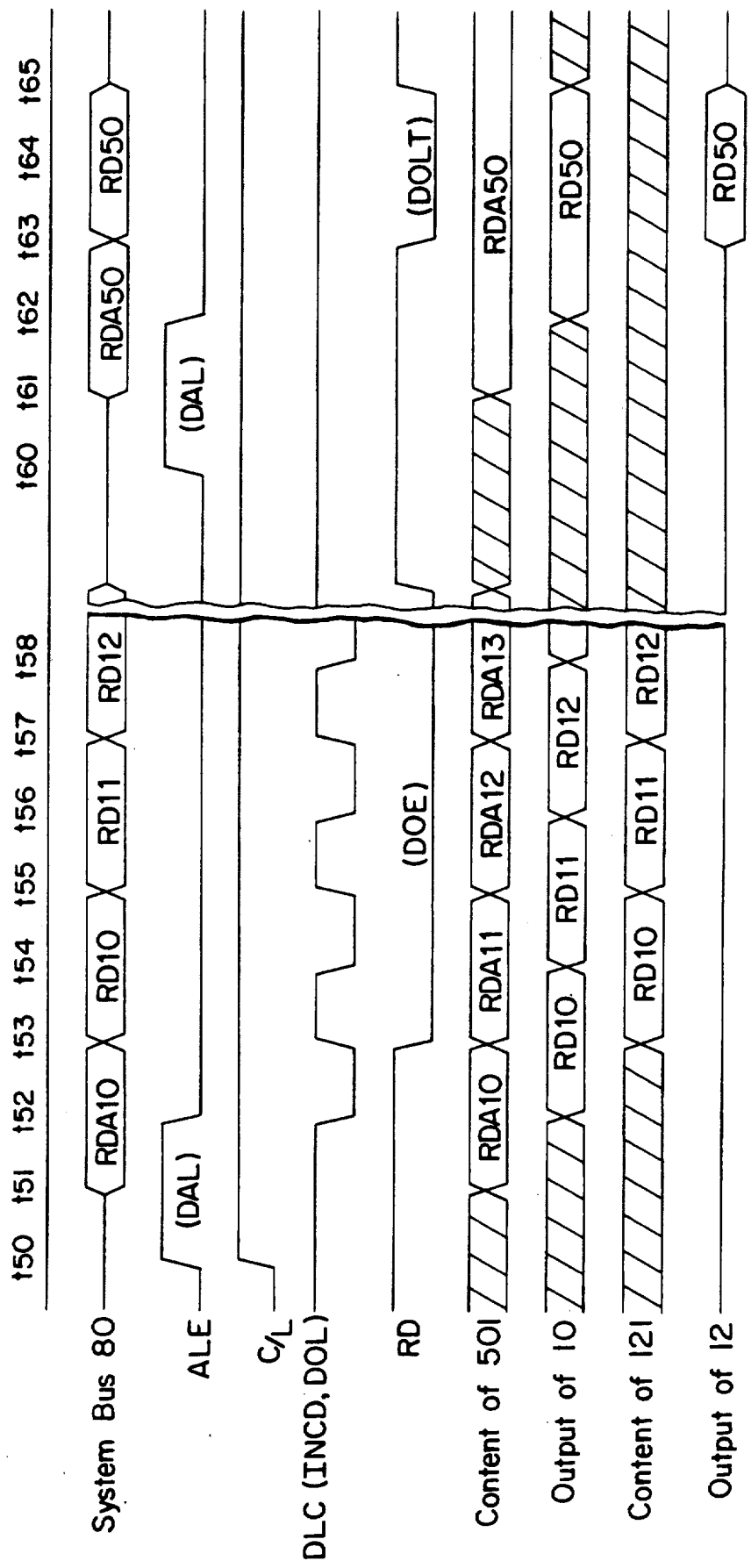
FIG. 6 is a timing chart representative of an operation of the microcomputer system shown in FIG. 4.

The instruction fetch bus cycle and the data write bus cycle of the microcomputer system 1000 are omitted, because they are the same as the system 100 shown in FIG. 1 and represented by the timing chart of FIG. 3. The data read bus cycles for successive operand data and random operand data are described below with reference to FIGS. 4 to 6.

At the timing $t_{50}$, the bus control unit 52 changes the signals ALE and C/L to the high level and then transfers onto the system bus 80 a read data address RDA10 for the starting one of the successive operand data. The address RDA10 is transferred to the bus 31 via the bus control unit 200 and fetched by the address counter 501. At the timing $t_{52}$, the signal ALE is changed to the low level, so that the counter 501 latches the address RDA10 and operand data RD10 is read out from the data memory 10. The unit 52 further changes the signal DLC to the low level at the timing $t_{52}$. At the timing $t_{53}$, the signal $\overline{RD}$ is changed to the low level and the signal DLC is changed to the high level. In response thereto, the output latch circuit 121 latches and transfers the data RD10 onto the bus 32 and the address counter 501 increments the content thereof by one to produce a next address RDA11. The data RD10 on the bus 32 is then transferred onto the system bus 80 by the bus interface unit 200. The bus control unit 52 fetches and supplies the data RD10 to the execution unit 51 at the timing $t_{54}$ and further changes the signal DLC to the low level. Next operand data RD11 is thereby read out of the data memory 10 by the data address RDA11. Thus, by receiving the signal DLC in a pulse shape, the memory device outputs the successive operand data without receiving the respective data addresses.

In response to a request that the execution unit 51 requires operand data that is stored in an address location other than the above successive data address locations, the bus control unit 52 changes the signal ALE to the high level with hold the signal C/L at the high level at the timing $t_{60}$ and then transfers a read data address RDA50 onto the system bus 80 at the timing $t_{61}$. The signal DAL is thereby produced, so that the address RDA50 is fetched by the address counter 501. In response to the falling edge of the signal ALE at the timing $t_{62}$, the counter 501 latches the address RDA50 and operand data RD50 is read out from the address location of the data memory 10 designated by the address RDA50. Since the current bus cycle is not the bus cycle for reading continuously the successive data, the signal DLC is maintained at the high level. Therefore, the flip-flop circuit 44 produces at its output Q the high level in response to the delayed falling edge of the signal ALE. Thereafter, the bus control unit 52 changes the signal $\overline{RD}$ to the low level at the timing $t_{63}$, so that the high level signal DOLT is generated. The output buffer 12 is thereby made open to transfer the data RD50 onto the bus 32. This data RD50 is then transferred to the system bus 80 by the bus interface unit 200. The bus control unit 52 fetches the data RD50 at the timing $t_{64}$. The signal $\overline{RD}$ is returned to the high level at the timing $t_{65}$, so that the output buffer 12 is closed.

The present invention is not limited to the above embodiments, but may be changed and modified without departing from the scope and spirit of the invention.

What is claimed is:

1. A semiconductor memory device comprising a set of address/data terminals, a first terminal supplied with an address latch-enable signal, a second terminal supplied with a data selection signal for selecting one of first and second modes, a third terminal supplied with an updating control signal, an address counter, an address register, first means for coupling said set of address/data terminals to said address counter and said address register, second means coupled to said first and second terminals for producing a first latch signal in response to said address latch-enable signal and said first mode selected by said data selection signal and for producing a second latch signal in response to said address latchenable signal and said second mode selected by said data selection signal, third means coupled to said second and third terminals for producing a count updating signal in response to said updating control signal and said first mode selected by said data selection signal, fourth means for supplying said first latch signal and said count updating signal to said address counter, fifth means for supplying said second latch signal to said address register, said address counter fetching address information at said set of address/data terminals in response to said first latch signal and updating the fetched address information in response to said count updating signal, said address register fetching addres information at said set of address/data terminals in response to said second latch signal, a memory portion having a plurality of addressable memory locations, sixth means responsive to the address information from said address counter for accessing said memory portion to read out data therefrom, seventh means responsive to the address information from said address register for accessing said memory portion to read out data therefrom, and eighth means coupled between said memory portion and said set of address/data terminals for transferring the data from said memory portion to said set of address/data terminals.

2. The memory device as claimed in claim 1, wherein said memory portion includes first and second memory parts, said sixth means accessing said first memory part, said seventh means accessing said second part, and said eighth means includes an output latch circuit for temporarily latching the data from said first memory part and an output buffer for transferring the data from said second memory part to said set of address/data terminals.

3. The memory device as claimed in claim 2, wherein said first memory part comprises a read only memory for storing a string of instructions and said second memory part comprises a random access memory for temporarily storing operand data.

4. The memory device as claimed in claim 1, further comprising means coupled to said second and third terminal for producing an additional count updating signal in response to said updating control signal and said second mode selected by said data selection signal and means responsive to said additional count updating signal for updating the address information latched in said address register.

5. A semiconductor memory device comprising a set of address/data terminals, a first terminal supplied with an address latch signal, a second terminal supplied with a data designation signal taking one of first and second states, a third terminal supplied with a count control signal, a fourth terminal supplied with a read-enable signal, first and second address counters, means responsive to said address latch signal for coupling said set of address/data terminals to said first and second address counters, means coupled to said first and second terminals for supplying a first latch signal to said first address counter in response to said address latch signal and said data designation signal taking said first states and for supplying a second latch signal to said second address counter in response to said address latch signal and said data designation signal taking said second states, means coupled to said second and third terminals for supplying a first count updating signal to said first address counter in response to said count control signal and said data designating signal taking said first state and for supplying a second count updating signal to said second address counter in response to said count control signal and said data designating signal taking said second state, said first address counter fetching address information at said set of address/data terminals in response to said first latch signal and updating the latched address information in response to said first count updating signal, said second address counter fetching address information at said set of address/data terminals in response to said second latch signal and updating the latched address information in response to said second count updating signal, first and second memory portions each having a plurality of addressable memory locations, first access means responsive to the address information from said first address counter for accessing said first memory portion to read out data therefrom, second access means responsive to the address information from said second address counter for accessing said second memory portion, first data transferring means coupled to said first memory portion and said second and fourth terminals for transferring the data from said first memory portion to said set of address/data terminals in response to said read-enable signal and said data designation signal taking said first state, and second data transferring means coupled to said second memory portion and said second and fourth terminals for transferring the data from said second memory portion to said set of address/data terminals in response to said read-enable signal and said data designation signal taking said second state.

6. The memory device as claimed in claim 5, wherein said first memory portion comprises a read only memory and said second memory portion comprises a random access memory.

7. The memory device as claimed in claim 5, wherein said first data transferring means includes a first output latch circuit latching the data from said first memory portion in response to said first count updating signal and said second data transferring means includes a second output latch circuit latching the data from said second memory portion in response to said second count updating signal and an output buffer transferring the data from said second memory portion without being latched in said second output latch circuit.

8. A microcomputer system comprising: a semiconductor memory including, on a single semiconductor chip, a set of address/data terminals, a first terminal supplied with an address latch-enable signal, a second terminal supplied with a data selection signal for selecting one of first and second modes, a third terminal supplied with an updating control signal, an address counter, an address register, first means for coupling said set of address/data terminals to said address counter and said address register, second means coupled to said first and second terminals for producing a first latch signal in response to said address latch-enable signal and said first mode selected by said data selection signal and for producing a second latch signal in response to said address latchenable signal and said second mode selected by said data selection signal, third means coupled to said second and third terminals for producing a count updating signal in response to said updating control signal and said first mode selected by said data selection signal, fourth means for supplying said first latch signal and said count updating signal to said address counter, fifth means for supplying said second latch signal to said address register, said address counter fetching address information at said set of address/data terminals in response to said first latch signal and updating the fetched address information in response to said count updating signal, said address register fetching address information at said set of address/data terminals in response to said second latch signal, a memory portion having a plurality of addressable memory locations, sixth means responsive to the address information from said address counter for accessing said memory portion to read out data therefrom, seventh means responsive to the address information from said address register for accessing said memory portion to read out data therefrom, and eighth means coupled between said memory portion and said set of address/data terminals for transferring the data from said memory portion to said set of address/data terminals; a microprocessor including a set of address/data terminals and means for supplying said address latch-enable signal, said data selection signal and said updating control signal to said first, second and third terminals of said semiconductor memory device, respectively; and a system address/data bus interconnecting said set of address/data terminals of said semiconductor memory device and said set of address/data terminals of said microprocessor.

9. A microcomputer system comprising: a semiconductor memory unit including, on a single semiconductor chip, a set of address/data terminals, a first terminal supplied with an address latch signal, a second terminal supplied with a data designation signal taking one of first and second states, a third terminal supplied with a count control signal, a fourth terminal supplied with a readenable signal, first and second address counters, means responsive to said address latch signal for coupling said set of address/data terminals to said first and second address counters, means coupled to said first and second terminals for supplying a first latch signal to said first address counter in response to said address latch signal and said data designation signal taking said first states and for supplying a second latch signal to said second address counter in response to said address latch signal and said data designation signal taking said second states, means coupled to said second and third terminals for supplying a first count updating signal to said first address counter in response to said count control signal and said data designating signal taking said first state and for supplying a second count updating signal to said second address counter in response to said count control signal and said data designating signal taking said second state, said first address counter fetching address information at said set of address/data terminals in response to said first latch signal and updating the latched address information in response to said first count updating signal, said second address counter fetching address information at said set of address/data terminals in response to said second latch signal and updating the latched address information in response to said second count updating signal, first and second memory portions each having a plurality of addressable memory locations, first access means responsive to the address information from said first address counter for accessing said first memory portion to read out data therefrom, second access means responsive to the address information from said second address counter for accessing said second memory portion, first data transferring means coupled to said first memory portion and said second and fourth terminals for transferring the data from said first memory portion to said set of address/data terminals in response to said read-enable signal and said data designation signal taking said first state, and second data transferring means coupled to said second memory portion and said second and fourth terminals for transferring the data from second memory portion to said set of address/data terminals in response to said read-enable signal and said data designation signal taking said second state; a microprocessor unit including a set of address/data terminals and means for supplying said address latch signal, said data designation signal, said count control signal and said read-enable signal to said first, second, third and fourth terminals of said semiconductor memory unit, respectively; and a system bus interconnecting said microprocessor and said semiconductor memory unit.

* * * * *